United States Patent
Yu et al.

(10) Patent No.: US 9,905,520 B2
(45) Date of Patent: Feb. 27, 2018

(54) SOLDER BALL PROTECTION STRUCTURE WITH THICK POLYMER LAYER

(75) Inventors: Chen-Hua Yu, Hsin-Chu (TW); Lawrence Chiang Sheu, Hsin-Chu (TW); Hao-Yi Tsai, Hsin-Chu (TW); Chien-Hsiun Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 548 days.

(21) Appl. No.: 13/162,297

(22) Filed: Jun. 16, 2011

(65) Prior Publication Data

US 2012/0319251 A1 Dec. 20, 2012

(51) Int. Cl.
| | |
|---|---|
| *H01L 23/485* | (2006.01) |
| *H01L 23/488* | (2006.01) |
| *H01L 23/528* | (2006.01) |
| *H01L 23/00* | (2006.01) |
| *H01L 23/31* | (2006.01) |

(52) U.S. Cl.
CPC .......... *H01L 24/05* (2013.01); *H01L 23/3114* (2013.01); *H01L 24/11* (2013.01); *H01L 24/13* (2013.01); *H01L 24/16* (2013.01); *H01L 2224/0401* (2013.01); *H01L 2224/05012* (2013.01); *H01L 2224/05147* (2013.01); *H01L 2224/05155* (2013.01); *H01L 2224/05556* (2013.01); *H01L 2224/05558* (2013.01); *H01L 2224/05569* (2013.01); *H01L 2224/05571* (2013.01); *H01L 2224/05572* (2013.01); *H01L 2224/05647* (2013.01); *H01L 2224/05666* (2013.01); *H01L 2224/1146* (2013.01); *H01L 2224/11849* (2013.01); *H01L 2224/131* (2013.01); *H01L 2224/16225* (2013.01); *H01L 2224/16227* (2013.01); *H01L 2924/00014* (2013.01); *H01L 2924/014* (2013.01); *H01L 2924/01023* (2013.01); *H01L 2924/01029* (2013.01); *H01L 2924/12042* (2013.01); *H01L 2924/3512* (2013.01)

(58) Field of Classification Search
CPC ......... H01L 24/05; H01L 24/11; H01L 24/13; H01L 24/16; H01L 2224/0401; H01L 2224/05569; H01L 2224/05571; H01L 2224/05572; H01L 2224/16227
See application file for complete search history.

(56) References Cited

U.S. PATENT DOCUMENTS

| | | | |
|---|---|---|---|
| 6,181,569 B1 * | 1/2001 | Chakravorty | ....... H01L 23/3114 228/122.1 |
| 7,863,742 B2 | 1/2011 | Yu et al. | |
| 2007/0205520 A1 * | 9/2007 | Chou | ................... H01L 23/3157 257/780 |

(Continued)

*Primary Examiner* — Marcos D Pizarro
(74) *Attorney, Agent, or Firm* — Slater Matsil, LLP

(57) ABSTRACT

An integrated circuit structure includes a substrate and a metal pad over the substrate. A post-passivation interconnect (PPI) line is connected to the metal pad, wherein the PPI line includes at least a portion over the metal pad. A PPI pad is connected to the PPI line. A polymer layer is over the PPI line and the PPI pad, wherein the polymer layer has a thickness greater than about 30 μm. An under-bump metallurgy (UBM) extends into an opening in the polymer layer and electrically connected to the PPI pad.

3 Claims, 6 Drawing Sheets

(56) References Cited

U.S. PATENT DOCUMENTS

| | | | |
|---|---|---|---|
| 2008/0006945 A1* | 1/2008 | Lin | H01L 23/3192 257/758 |
| 2009/0014869 A1* | 1/2009 | Vrtis et al. | 257/737 |
| 2009/0189286 A1 | 7/2009 | Daubenspeck et al. | |
| 2010/0193950 A1* | 8/2010 | Lee et al. | 257/738 |

* cited by examiner

SOLDER BALL PROTECTION STRUCTURE WITH THICK POLYMER LAYER

BACKGROUND

Modern integrated circuits are made up of literally millions of active devices such as transistors and capacitors. These devices are initially isolated from each other, and are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits.

On top of the interconnect structures, bond pads are formed and exposed on the surface of the respective chip. Electrical connections are made through the bond pads to connect the chip to a package substrate or another die. Bond pads can be used for wire bonding or flip-chip bonding.

Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls. In a conventional interconnect structure used in the WLCSP, an aluminum pad is formed to electrically connect to devices formed on a surface of the silicon substrate in the same die. A passivation layer is formed. The passivation layer includes a portion over the aluminum pad. An opening is formed in the passivation layer to expose the aluminum pad. A first polymer layer is formed over the passivation layer, and is patterned to expose the aluminum pad. A post-passivation interconnect (PPI) line is then formed, followed by the formation of a second polymer layer, and an under-bump metallurgy (UBM). The UBM is formed in an opening penetrating through the second polymer. A solder ball may then be placed on the UBM. The first and the second polymers may be formed of spin coating. The thickness of the second polymer is typically between about 7 μm and about 10 μm.

The above-discussed WLCSP may be bonded onto a printed circuit board (PCB). To be able to have the option of replacing a defect WLCSP bonded on the PCB with a good WLCSP, it is preferable that no underfill is filled between the WLCSP and the PCB. Such configuration, however, limits the die size of the current WLCSP technology to 5 mm×5 mm and below. The reason is that without the protection of the underfill, the thermal mismatch between the die in the WLCSP and the PCB can induce solder joint crack during the thermal cycling or drop test. Therefore, for large-die applications, flip-chip packaging is required to use underfill, and direct-on-board die bonding is allowed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A post-passivation structure and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
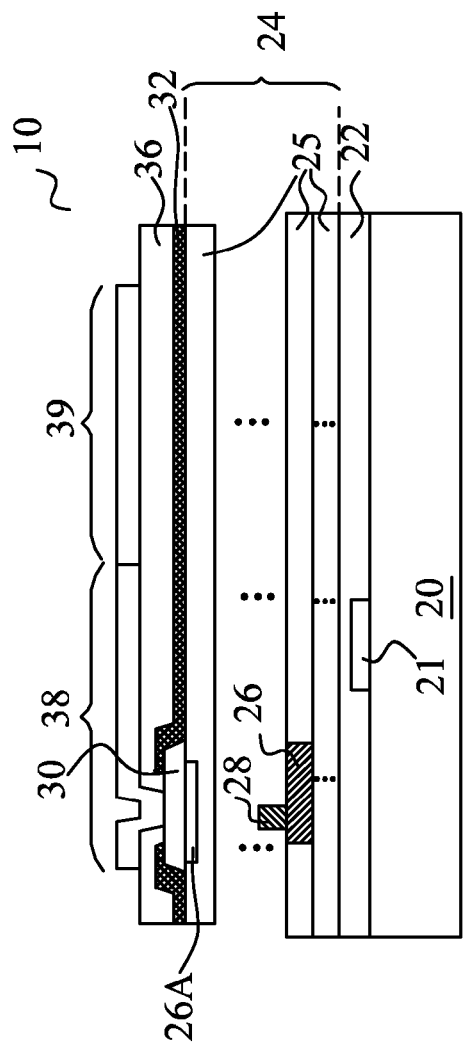
FIGS. 1 through 3 are cross-sectional views of intermediate stages in the manufacturing of a post-passivation structure in accordance with an embodiment.

Referring to FIG. 1, wafer 10, which includes semiconductor substrate 20, is provided. Semiconductor substrate 20 may be a bulk silicon substrate or a silicon-on-insulator substrate. Other semiconductor materials including group III, group IV, and group V elements may also be used. Integrated circuit devices such as transistors (schematically illustrated as 21) are formed at the surface of semiconductor substrate 20. Wafer 10 may further includes inter-layer dielectric (ILD) 22 over semiconductor substrate 20, and metallization layers 24 over ILD 22. Metallization layers 24 include dielectric layers 25, and metal lines 26 and vias 28 in dielectric layers 25. In an embodiment, dielectric layers 25 are formed of low-k dielectric materials. The dielectric constants (k values) of the low-k dielectric materials may be less than about 2.8, or less than about 2.5, for example. Metal lines 26 and vias 28 may be formed of copper or copper alloys, although they can also be formed of other metals. One skilled in the art will realize the formation details of the metallization layers. In subsequent drawings, semiconductor substrate 20, ILD 22, and metallization layers 24 are not illustrated. Top metal pad 26A is formed as a part of the top metallization layer.

Metal pad 30 is formed over metallization layers 24, and may contact top metal pad 26A, or alternatively, electrically coupled to top metal pad 26A through a via. Metal pad 30 may be an aluminum pad or an aluminum copper pad, and hence is alternatively referred to as aluminum pad 30 hereinafter, although other metallic materials may be used. Passivation layer 32 is formed over metallization layers 24. A portion of passivation layer 32 is formed to cover edge portions of aluminum pad 30. A central portion of aluminum pad 30 is exposed through the opening in passivation layer 32. In an embodiment, passivation layer 32 is formed of a composite layer comprising a silicon oxide layer (not shown), and a silicon nitride layer (not shown) over the silicon oxide layer. Passivation layer 32 may also be formed of other non-organic materials such as un-doped silicate glass (USG), silicon oxynitride, and/or the like. Furthermore, passivation layer 32 may be a single layer or a composite layer. Passivation layer 32 may be formed of a non-porous material.

Polymer layer 36 is formed over passivation layer 32. Polymer layer 36 may be formed of a polymer such as an epoxy, polyimide, benzocyclobutene (BCB), polybenzoxazole (PBO), and the like, although other relatively soft, often organic, dielectric materials can also be used. The formation methods include spin coating or other methods.

Polymer layer 36 is patterned to form an opening, through which aluminum pad 30 is exposed. The patterning of polymer layer 36 may include photo lithography techniques. A curing may then be performed to cure polymer layer 36. Post-passivation interconnect (PPI) line 38 and PPI pad 39 are formed to electrically connect to aluminum pad 30 through the openings in passivation layer 32 and polymer layer 36. Post-passivation interconnect (PPI) line 38 and PPI pad 39 are such named since they are formed after the formation of passivation layer 32. PPI line 38 and PPI pad 39 may be formed simultaneously, and may be formed of a same material, which may be, for example, substantially pure copper or a copper alloy. Accordingly, PPI pad 39 is an extending portion of PPI line 38. PPI line 38 and PPI pad 39 may further include a nickel-containing layer (not shown) on the top of copper. The formation methods include plating, electroless plating, sputtering, chemical vapor deposition methods, and the like. In a top view of the structure in FIG. 1, PPI line 38 may be a strip, and PPI pad 39 may have a hexagon or an octagon shape. Through the routing of PPI line 38, PPI pad 39 may be, or may not be, located directly over aluminum pad 30. With the connection of PPI line 38, PPI pad 39 may be formed vertically misaligned with metal pad 30, and may be used, for example, to route electrical connection from a center of the respective die to a peripheral region of the die.

Figure 2:
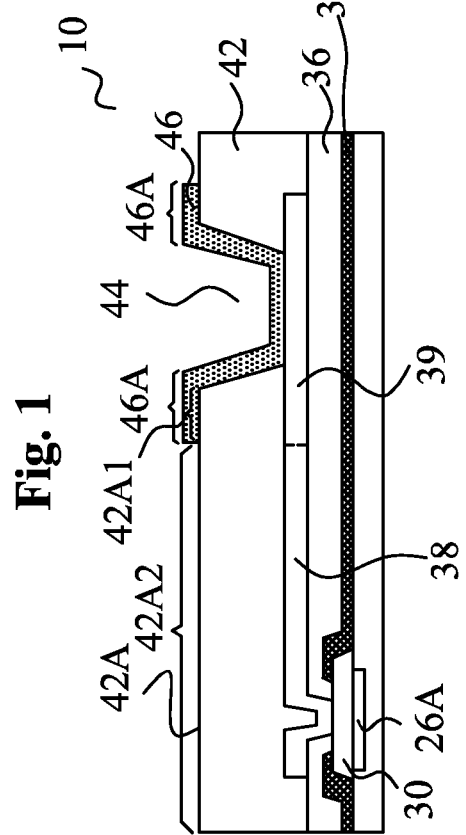

FIG. 2 illustrates the formation and patterning of polymer layer 42. Polymer layer 42 may include a polymer selected from an epoxy, polyimide, BCB, and PBO, and may be patterned using the same method as patterning polymer layer 36. In an embodiment, polymer layer 42 is a laminate film, which is laminated on PPI line 38, PPI pad 39, and polymer layer 36.

Polymer layer 42 may have a relatively high elasticity. Since polymer layer 42 is thick, the polymers used for forming conventional thin polymer layers using spin coating may not be usable for forming polymer layer 42. Furthermore, polymer layer 42 may be formed of material that is suitable to form a laminate film before cured. In the formation of polymer layer 42, the laminate film is adhered on wafer 10. After the formation of UBM 46 and possibly solder ball 50, the laminate film may be cured, for example, under elevated temperatures or under ultra-violet light. To reduce the cost of the patterning step for forming opening 44 (FIG. 2), polymer layer 42 (and the respective laminate film) may also be formed of a photosensitive material, which may be patterned easily after exposure.

Opening 44 is formed in polymer layer 42 to expose the underlying PPI pad 39. The formation methods of opening 44 may include lithography, wet or dry etching, laser drill, and/or the like. UBM 46 is then formed to extend into opening 44, and to contact PPI pad 39. UBM 46 may further comprise portions directly over polymer layer 42 to form overhangs 46A. Accordingly, as shown in FIG. 2, polymer layer 42 may have top surface 42A, which comprises a first portion (marked as 42A1) directly under overhang 46A of UBM 46, and a second portion (marked as 42A2) in contact with first portion 42A1 and not directly under UBM 46. The bottom surface of overhangs 46A contact top surface 42A of polymer layer 42. In an embodiment, UBM 46 is formed of a conductive material such as copper, copper alloys, titanium, or titanium alloy, although other metallic materials may also be used.

Figure 3:
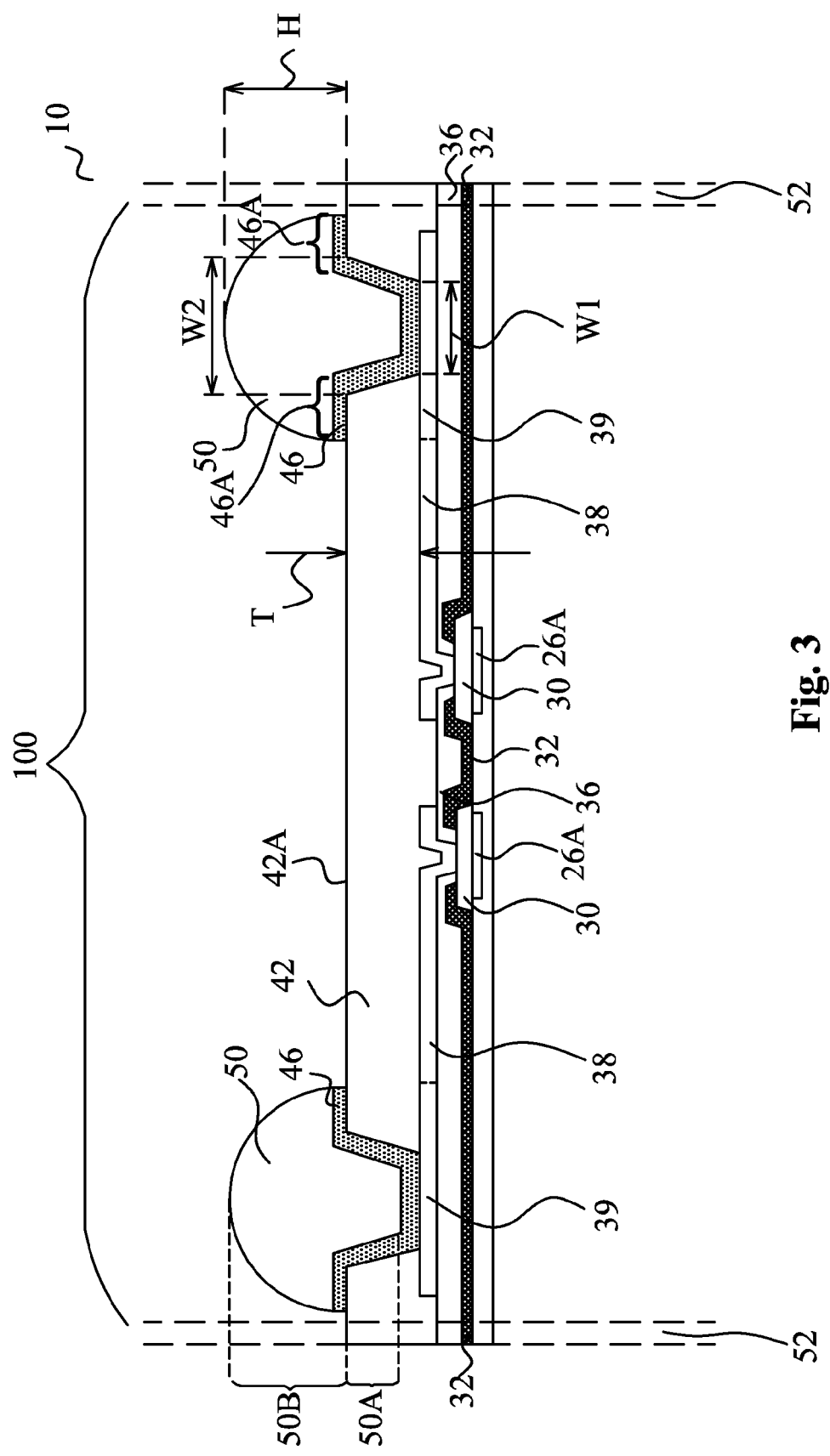

As shown in FIG. 3, solder ball 50 is formed on UBM 46 and then reflowed. In an embodiment, the solder ball 50 is formed by placing solder ball on the UBM 46. In some embodiments, the solder ball 50 is formed by solder plating process with photolithography technology. Each of solder balls 50 may include portion 50A that is in polymer layer 42, and portion 50B that is above polymer layer 42. It is realized that in the same chip (wafer), there may be a plurality of post-passivation structures including aluminum pads 30, PPI lines 38, UBMs 46, and solder balls 50, as shown in FIG. 3. As a result, polymer layer 42 is formed in the region between neighboring UBMs 46. Polymer layer 42 may also be a layer extending across substantially the entire wafer 10, and top surface 42A of polymer layer 42 may be substantially flat and extend from directly under a first one of solder balls 50 to directly under a second ones of solder balls 50. Furthermore, the top surface 42A comprises a portion not directly under overhangs 46A, and portions directly under overhangs 46A. After the formation of solder ball(s) 50, wafer 10 may be sawed along scribe lines 52 into a plurality of dies identical to the illustrated die 100.

Thickness T of polymer layer 42 may be greater than 30 µm, and may be greater than about 100 µm. Thickness T may also be between about 30 µm and about 200 µm. With a great thickness, polymer layer 42 acts as an efficient stress buffer. After die 100 is bonded to another package component (such as a printed circuit board), the stand-off distance between die 100 and the package component is increased due to thickness T. The distance between substrate 20 and the package component is also increased. As a result, the stresses applied to solder balls 50, semiconductor substrate 20, and integrated circuit devices 21 (FIG. 1), are reduced. With a thick portion of solder ball 50 being buried in polymer layer 50, the increase in the distance between substrate 20 and the package component does not cause the increase in the lateral size of solder balls 50. To increase the stand-off distance after die 100 is bonded to the package component, height H, which is the height of the portion of solder 50 over top surface 42A of polymer layer 42, is also great, and may be greater than about 100 µm, between about 100 and about 250 µm, or between about 200 µm and about 250 µm. The ratio H/T needs to be adjusted to achieve maximized protection for solder ball 50 and integrated circuit devices 21, while at the same time not cause solder balls 50 to be bigger than necessary. In an embodiment, ratio $H/T1$ is between about 250/30 and about 300/200.

Figure 4:
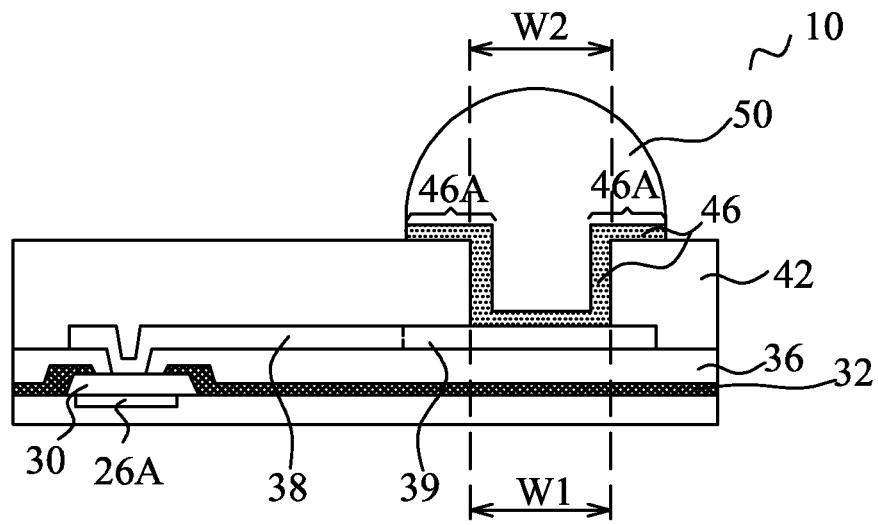
FIGS. 4 through 11 illustrate post-passivation structures in accordance with various alternative embodiments.
Figure 5:
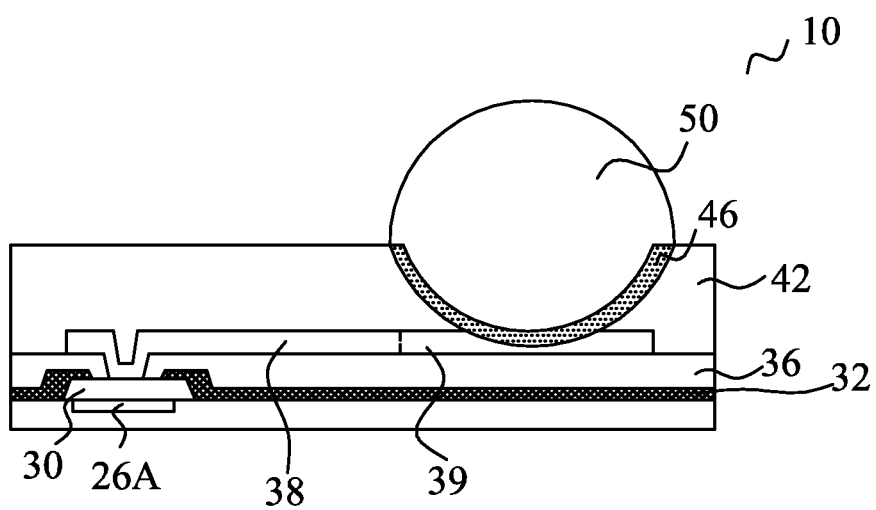

FIGS. 4 through 11 illustrate post-passivation structures in accordance with alternative embodiments. Unless specified otherwise, the reference numerals in these embodiments represent like elements in the embodiments illustrated in FIGS. 1 through 3. Particularly, the structure, material, and the thickness of polymer layer 42 in these embodiments may be essentially the same as what are shown in FIGS. 1 through 3. In FIG. 3, the portion of UBM 46 in polymer layer 42 has a tapered profile, and bottom width W1 of UBM 46 is smaller than top width W2 of UBM 46. In FIG. 4, the sidewall portions of UBM 46 in polymer layer 42 are substantially vertical, and hence bottom width W1 of UBM 46 is substantially equal to top width W2 of UBM 46. In FIG. 5, the portion of UBM 46 in polymer layer 42 has a semi-sphere shape, which has a continuously changed profile. Such a continuously changed profile of UBM 46 is beneficial for reducing the stress applied to solder ball 50 since there is no corner, and hence there is no stress concentration point. The semi-sphere opening in polymer layer 42 may be formed by adjusting the etching conditions and/or the composition of etchants. In an embodiment, the semi-sphere opening may be formed by a fine-tuned photo process. In some embodiments, overhang portions 46A of UBM 46, which overhang portions are horizontal portions directly over polymer layer 42, may be formed, such as what are shown in FIGS. 3 and 4, or not formed, such as what is shown in FIG. 5.

Figure 6:
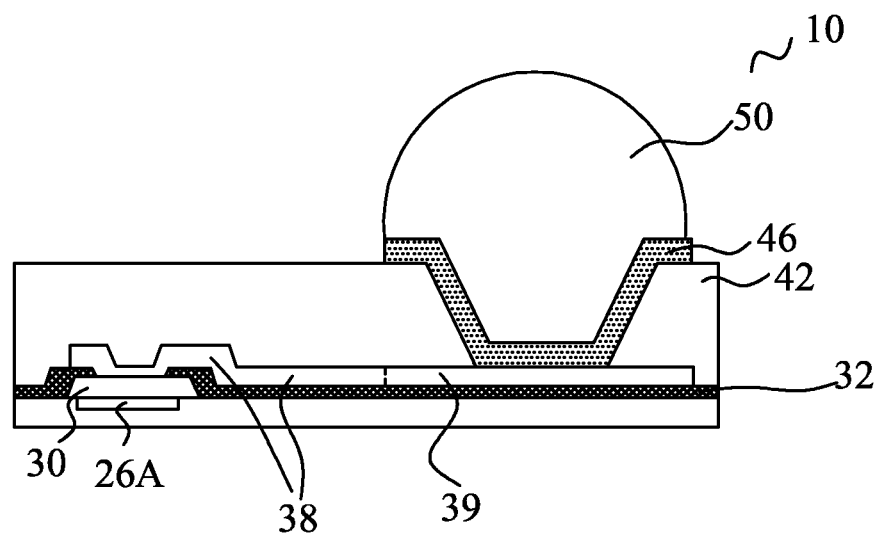
Figure 7:
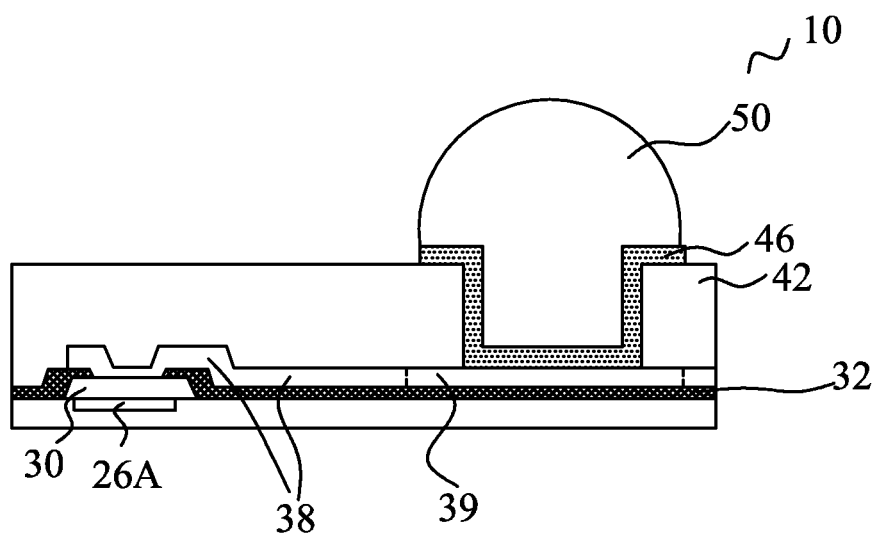
Figure 8:
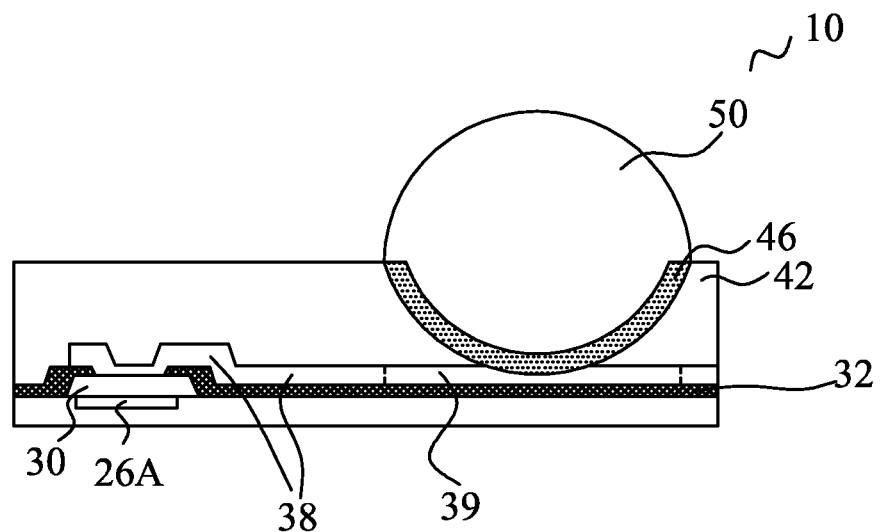

FIGS. 6, 7, and 8 illustrate the embodiments similar to the embodiments in FIGS. 3, 4, and 5, respectively, except that polymer layer 36 is not formed. Instead, PPI line 38 and PPI pad 39 are formed over and contacting passivation layer 32. Polymer layer 42 may also contact passivation layer 32.

Figure 9:
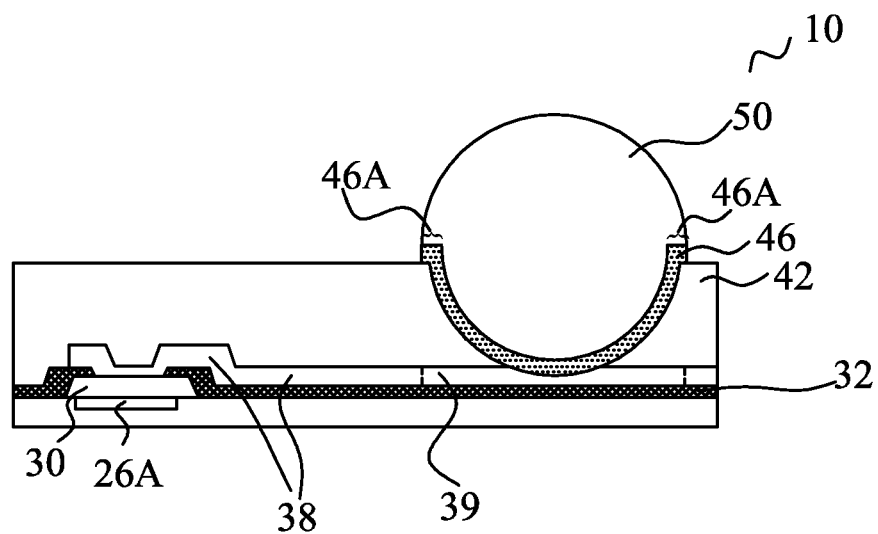
Figure 10:
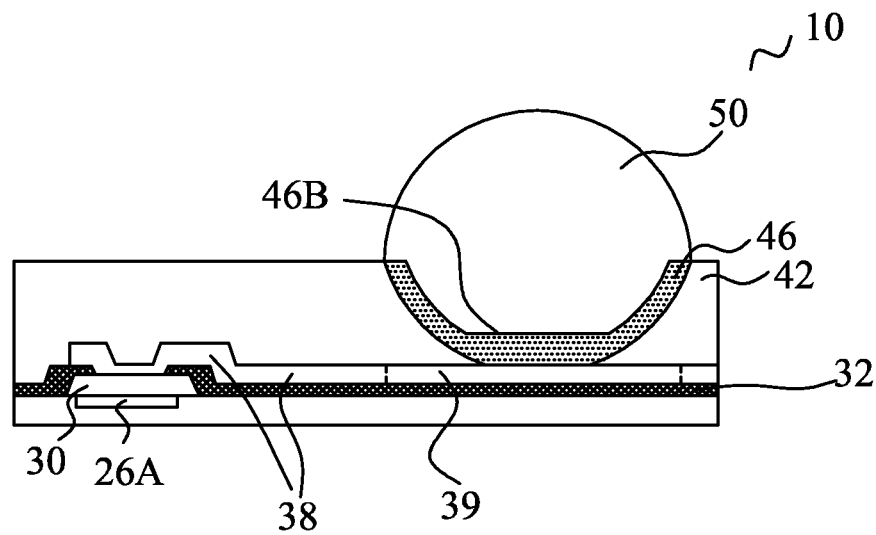
Figure 11:
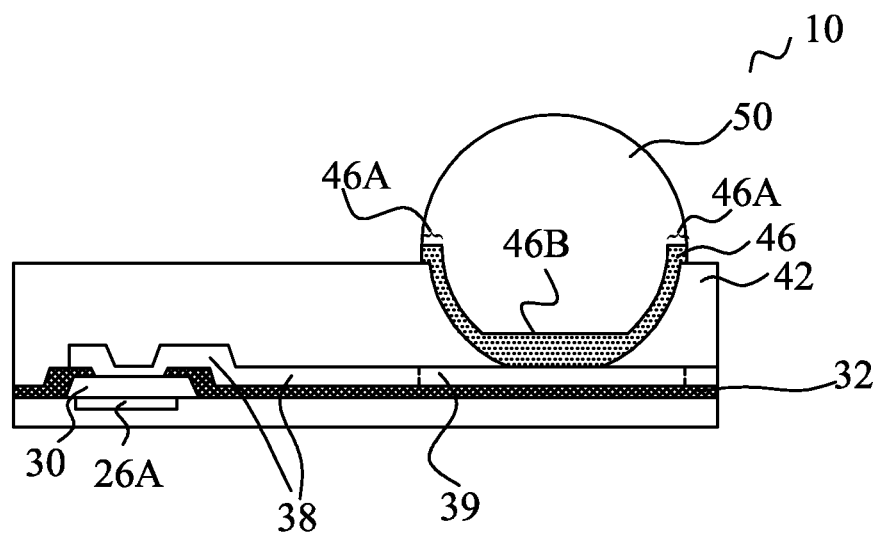

FIGS. 9, 10, and 11 illustrate the embodiments in which UBMs 46 have different profiles. In FIGS. 9 and 11, UBMs 46 include overhang portions 46A, while no UBM overhang is formed in FIG. 10. The bottom portions of UBMs 46 may also have different profiles. For example, in FIG. 9, the bottom portion of UBM 46 that contacts PPI pad 39 has a continuous profile and does not have a flat top surface. In FIGS. 10 and 11, the bottom portion of UBM 46 that contacts PPI pad 39 has flat surface 46B.

As can be found from FIGS. 3 through 11, the profiles of the portion of UBM 46 in polymer layer 42 determine the profile of the respective solder ball 50. Accordingly, the portion of solder ball 50 in polymer layer 42 may also have tapered profiles, vertical profiles, semi-sphere shapes, continuous non-flat bottoms, or flat bottoms.

By increasing the thickness of polymer layer 42, unexpected results were observed. Simulation results revealed that the dies having a size of 7 mm×7 mm may pass substantially all thermal cycle tests including 500-thermal-cycles if the respective polymer layer 42 has a thickness greater than 30 µm. Conversely, substantially all dies having sizes of 7 mm×7 mm failed in the thermal cycle tests including 500-thermal-cycles if the respective polymer layer 42 has a thickness less than 30 µm.

In accordance with embodiments, an integrated circuit structure includes a substrate, and a metal pad over the substrate. A PPI line is connected to the metal pad, wherein the PPI line includes at least a portion over the metal pad. A PPI pad is connected to the PPI line. A polymer layer is over the PPI line and the PPI pad, wherein the polymer layer has a thickness greater than about 30 µm. A UBM extends into an opening in the polymer layer and electrically connected to the PPI pad.

In accordance with other embodiments, an integrated circuit structure includes a substrate; an aluminum pad over the substrate; a passivation layer including a portion over the aluminum pad; a PPI line connected to the aluminum pad, wherein the PPI line includes at least a portion over the aluminum pad; a PPI pad connected to the PPI line, wherein the PPI pad is vertically misaligned to the aluminum pad; a polymer layer over the PPI line and the PPI pad, wherein the polymer layer has a thickness greater than about 30 µm; and a UBM extending into an opening in the polymer layer and contacting the PPI pad. The polymer layer has a flat top surface comprising a first portion directly under a portion of the UBM, and a second portion in contact with the first portion and not directly under the UBM. A solder ball is over and contacting the UBM.

In accordance with yet other embodiments, an integrated circuit structure includes a metal pad over a substrate, a passivation layer including a portion over the metal pad, and a PPI line connected to the metal pad through an opening in the passivation layer, wherein the PPI line includes at least a portion over the metal pad. A PPI pad is connected to the PPI line. A polymer layer is over the PPI line and the PPI pad, wherein the polymer layer has a thickness greater than about 30 µm. A UBM extends into an opening in the polymer layer and electrically connected to the PPI pad. The UBM includes a portion in the polymer layer and having a semispherical shape. A solder ball is over and contacting the UBM.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
 a substrate;
 a low-k dielectric layer over the substrate;
 a copper-containing pad in the low-k dielectric layer;
 a first metal pad and a second metal pad over the substrate and neighboring each other, wherein a top surface of the copper-containing pad is in physical contact with a bottom surface of the first metal pad;
 a passivation layer over the low-k dielectric layer, wherein the passivation layer comprises a first portion overlapping edge portions of the first metal pad, and a second portion level with the first metal pad, wherein a portion of the passivation layer between the first metal pad and the second metal pad has a first top surface, and portions of the passivation layer directly overlying the first metal pad and the second metal pad have second top surfaces higher than the first top surface;
 a first polymer layer over the passivation layer;
 a post-passivation interconnect (PPI) line connected to the first metal pad, wherein the PPI line comprises a via portion extending into the first polymer layer to contact the first metal pad, and wherein the first portion of the passivation layer is spaced apart from the via portion of the PPI line by the first polymer layer;
 a PPI pad connected to the PPI line, wherein the PPI pad is an extending portion of the PPI line;
 a second polymer layer over the PPI line and the PPI pad; and
 a first and a second under-bump metallurgy (UBM) extending into openings in the second polymer layer, wherein the first UBM is electrically connected to the PPI pad, and wherein the second polymer layer comprises a top surface continuously extending from directly under a first overhang portion of the first UBM to directly under a second overhang portion of the second UBM.

2. The integrated circuit structure of claim 1, wherein a thickness of the second polymer layer is greater than about 30 µm.

3. The integrated circuit structure of claim 1, wherein the top surface of the second polymer layer is substantially flat, and wherein portions of the top surface of the second polymer layer that are directly under the first and the second overhang portions are substantially level with a portion of the top surface of the second polymer layer not directly under the first and the second overhang portions.

* * * * *